United States Patent [19]

Chiou

[11] Patent Number: 5,066,359

[45] Date of Patent: Nov. 19, 1991

[54] METHOD FOR PRODUCING SEMICONDUCTOR DEVICES HAVING BULK DEFECTS THEREIN

[75] Inventor: Herng-Der Chiou, Tempe

[73] Assignee: Motorola, Inc., Schaumburg, Ill.

[21] Appl. No.: 577,183

[22] Filed: Sep. 4, 1990

[51] Int. Cl.[5] .................. H01L 21/306; B44C 1/22
[52] U.S. Cl. .......................... 156/651; 148/33; 156/636; 156/643; 156/645; 156/657; 156/662; 437/225
[58] Field of Search .............. 156/628, 636, 643, 645, 156/651, 654, 657, 662; 148/33, DIG. 51; 437/10, 98, 225, 247; 252/79.5

[56] References Cited

U.S. PATENT DOCUMENTS

| | | | |
|---|---|---|---|
| 4,257,827 | 3/1981 | Schwuttke et al. | 148/1.5 |
| 4,314,595 | 2/1982 | Yamamoto et al. | 148/1.5 |
| 4,401,506 | 3/1983 | Otsuka | 156/612 |
| 4,410,395 | 10/1983 | Weaver et al. | 156/662 |
| 4,437,922 | 3/1984 | Bischoff et al. | 156/603 |
| 4,548,654 | 10/1985 | Tobin | 148/1.5 |
| 4,597,804 | 7/1986 | Imaoka | 148/1.5 |
| 4,659,400 | 4/1987 | Garbis et al. | 148/175 |
| 4,661,166 | 4/1987 | Hirao | 148/1.5 |
| 4,666,532 | 5/1987 | Korb et al. | 148/1.5 |
| 4,837,172 | 6/1989 | Mizuno et al. | 437/11 |
| 4,851,358 | 7/1989 | Huber | 437/10 |
| 4,868,133 | 9/1989 | Huber | 437/10 |
| 4,885,257 | 12/1989 | Matsushita | 437/11 |

OTHER PUBLICATIONS

Takano et al., "Annealing Effect of the Chemical Damage on Minute Defects, Heavy Metals and Oxygen Atoms in Silicon Crystal" Electro Chemical Society, vol. 81-5, Semiconductor Silicon 1981.

"Standard Test Method for Interstitial Atomic Oxygen Content of Silicon by Infrared Absorption" ASTM Designation F121,-83, pp. 191-192.

Bleiler et al., "SIMS Measurements of Oxygen in Heavily-Doped Silicon" Mat. Res. Soc. Sym. Proc., vol. 59 (1986) p. 73.

Yang et al., "On the Interaction of Intrinsic and Extrinsic Gettering Schemes in Silicon" Mat. Res. Symp. Proc. vol. 36, 1985, Materials Research Society.

Tsuya et al., "Behaviors of Thermally Induced Microdefects in Heavily Doped Silicon Wafers" Japanese Journal of Applied Physics, vol. 22, No. 1, Jan. 1983, pp. L16-L18.

Primary Examiner—William A. Powell
Attorney, Agent, or Firm—Joe E. Barbee

[57] ABSTRACT

A high density of bulk defects suitable for gettering fast diffusing impurities is provided in heavily doped N-type semiconductor (e.g., Si) wafers by forming a surface damage layer of predetermined thickness (e.g., by lapping and etching), then heating first to a temperature to facilitate precipitate nucleation (e.g., $SiO_x$) and second to a higher temperature to facilitate nuclei growth, and thereafter etching away the remaining surface damage. The correct amount of surface damage, accelerates the formation of bulk precipitate complexes for pinning heavy metals, beyond what would be obtained for the same temperature and time without the surface damage, and without inducing undesirable crystal defects.

16 Claims, 1 Drawing Sheet

METHOD FOR PRODUCING SEMICONDUCTOR DEVICES HAVING BULK DEFECTS THEREIN

FIELD OF THE INVENTION

The present invention relates to the fabrication of semiconductor devices and, more particularly, to improved means and methods for providing bulk defects therein to getter fast diffusing impurities which may be introduced during wafer processing.

BACKGROUND OF THE INVENTION

Semiconductor wafers, such as silicon wafers, are employed as substrates in the fabrication of a wide variety of semiconductor devices and semiconductor integrated circuits. To make the wafers, bulk silicon material is first melted in a crucible at high temperature in a crystal growing furnace. An elongated cylindrical single crystal is then formed from the melt and, after cooling, sliced into thin approximately circular wafers by sawing using means well known in the art. Typical wafer dimensions are, thickness of about 0.25–1.5 mm and diameters of about 100–300 mm, although other dimensions are also used. After various lapping, etching, polishing and cleaning steps, and sometimes epitaxial layer formation, the wafers are ready for wafer processing to form the intended devices or integrated circuits. Wafer processing generally comprises a complex series of etching, oxidation, masking, doping, and deposition steps to create various N and P regions within the wafers and to create various dielectric and conductor layers on the surface of the wafers, which make up the individual devices or circuits. Many of these wafer processing steps involve exposing the wafers to high temperature, e.g., 900–1200° C., for significant periods of time. Ordinarily, a wafer will contain many identical devices or circuits all fabricated at the same time.

The properties and quality of the semiconductor wafers play important roles in the difficulties encountered during wafer processing and in the final yield of working devices or circuits after wafer processing. Further, there is a complex interaction between the physical properties or state of the wafers and the various processing steps.

For example, the number of surface defects on the wafers has a great effect on wafer processing and manufacturing yield. These defects are often caused by impurities on the surface or in the bulk of the wafers and it is common to measure the surface defect density by selective etching prior to starting wafer processing. U.S. Pat. No. 4,410,395, which is incorporated herein by reference, describes a method for reducing these surface defects from 500,000 defects per square centimeter to less than 1000 defects per square centimeter. In this method, the front and back surfaces of an as-sawn wafer are lapped to remove about 35–40 micrometers of material from each side, the wafer is then heated to 1050° C. for 3–4 hours or 1250° C. for 1 hr. During heating most of the bulk impurities migrate to a residual strain region within 30–40 micrometers of the surface and the few that remain are trapped at deeper locations in the bulk. Following the heating step, the outer 30–40 micrometers of the surfaces of the wafer containing the trapped impurities are etched away. The etched wafer is then polished to remove an additional 20 micrometers of material from each surface. Wafers that have been lapped, heated, etched and polished as described above show much lower surface etch pit counts prior to wafer processing.

Frequently, precipitated oxygen complexes ($SiO_x$) are introduced into the wafers in order to provide sites for immobilizing fast moving impurities. Immobilization of fast moving impurities at defect sites is referred to in the art as "gettering". Techniques for introducing and controlling the distribution of $SiO_x$ complexes or other defect centers in silicon wafers are described, for example, in U.S. Pat. Nos. 4,257,827, 4,401,506, 4,437,922, 4,597,804, 4,666,532, 4,837,172, 4,851,358, 4,661,166, 4,885,257, 4,868,133, 4,548,654, 4,314,595, and 4,659,400, which are incorporated herein by reference.

While the above-described treatments are effective in lowering the levels of defects caused by impurities associated with crystal growth and/or wafer sawing and lapping, and even may trap some residuals deep in the bulk, and further may be effective in providing surface denuded (defect-free) zones and the like, they do not prevent or avoid other problems from occurring during wafer processing. For example, the majority of heavy metal contamination present in finished wafers is usually introduced during high temperature wafer processing steps rather than during crystal growth and starting wafer preparation. This is despite the best efforts to avoid such contamination. Heavy metals are often fast diffusing species that rapidly contaminate large portions of the wafer, adversely affecting their electrical and physical properties, even when present in relatively small amounts.

One known techniques for immobilizing heavy metals is to provide bulk defects in the wafer. In lightly doped materials this is relatively easy to accomplish. However, with heavily doped N-type materials (i.e., N+) such as for example, semiconductors having resistivities of less than about $10^{-1}$ ohm-cm, prior art techniques have not been successful in providing sufficient bulk defects to getter heavy metal contamination without also introducing so much crystal damage as to render the wafers unsuitable for high yield device or circuit manufacture. There is an ongoing need to find improved means and methods for immobilizing heavy metal contamination in N+ wafers.

SUMMARY OF THE INVENTION

It is an object of the present invention to provide an improved means and method for fabricating semiconductor devices and integrated circuits utilizing heavily doped N-type wafers wherein more bulk defects suitable for immobilizing heavy metal contamination are provided. It is a further object to provide such without introducing gross crystal defects that might adversely affect sensitive surface and device regions.

These and other objects and advantages are obtained by a method for fabricating semiconductor devices or circuits having bulk defects therein, comprising, providing a highly conductive semiconductor wafer containing a dissolved precipitatable impurity and having opposed principal surfaces, providing a predetermined amount of surface damage by, for example, lapping and etching one at least one principal wafer surface, heating the wafer to create bulk defects by surface damage enhanced bulk precipitation and growth of the dissolved impurity, and thereafter (desirably but not essentially) etching the surface to remove the remaining damage.

The forgoing method is particularly applicable to N-type wafers having a resistivity of less than about 0.1 ohm-cm and especially about equal or less than 0.01 ohm-cm. Oxygen, nitrogen, carbon and combinations thereof are non-limiting examples of precipitatable impurities. Non-limiting examples of suitable semiconductor materials are silicon or germanium or mixtures thereof. As, Sb and P are non-limiting examples of suitable conductivity altering N-type dopants for providing heavily doped N-type wafers.

Heating of the surface damaged wafers is carried out using at least two different temperatures, that is, a first heating step at a first temperature followed by a second heating step at a second, higher temperature. The two temperature heating sequence may be repeated. Also, additional, brief high temperature treatments (e.g., ~1000–1150° C. for 2–4 hrs) may also be used before or after the above-described heat treatment to enhance formation of a surface denuded zone.

The temperature of the first heating step is chosen to induce precipitate nucleation in the bulk and the temperature of the second heating step is chosen to induce nucleate growth in the bulk. Precipitate nucleation in the bulk of the wafer is accelerated by the presence of the residual surface damage layer. By controlling the thickness of the surface damage layer before heating, the formation of gross crystal defects (e.g., slip, twin planes, surface stacking faults, and the like) is avoided.

For oxygen, nitrogen and/or carbon in silicon, 4–50 hours at about 650–850° C. is suitable for the first heating step and about 900–1100° C. for similar times is suitable for the second heating step. Heating to about 750° C. for about 4–24 hours followed by heating to about 1000° C. for about 12–24 hours is effective.

it is desirable before heating to provide a surface damage layer having a depth of about 2–10 micrometers, with about 3–8 micrometers thickness being better, with 4–6 micrometers depth being preferred and about 5 micrometers depth being typical. If the surface damage layer is too shallow, the formation of bulk defects is not accelerated. If too deep, then a large number of gross crystal defects form in the wafer surface. The desired depth of surface damage is conveniently obtained by lapping the wafer surfaces to provide a surface damaged layer extending to a depth of at least 2 micrometers, more conveniently about 4–20 micrometers depth, preferably about 6–16 micrometers depth and typically about 10 micrometers depth, and then etching away sufficient depth of the surface damage layer so as to leave the desired damage depths described above. Etching away about half the thickness of the surface damage layer produced by lapping is convenient It is desirable that both major surfaces of the wafer be lapped and etched prior to heating since this improves surface cleanliness and provides the greatest defect nucleation acceleration effect in the bulk. After heating the remaining lap damage may be removed by further etching. It is also desirable to polish at least one wafer surface and then clean the wafer before commencing epitaxial layer growth or other wafer processing.

Wafers made according to the above-described process provide a higher density of bulk defects for immobilizing (gettering) heavy metal and other fast diffusing species introduced during wafer processing without creating gross crystal defects.

DETAILED DESCRIPTION

Figure 1A:
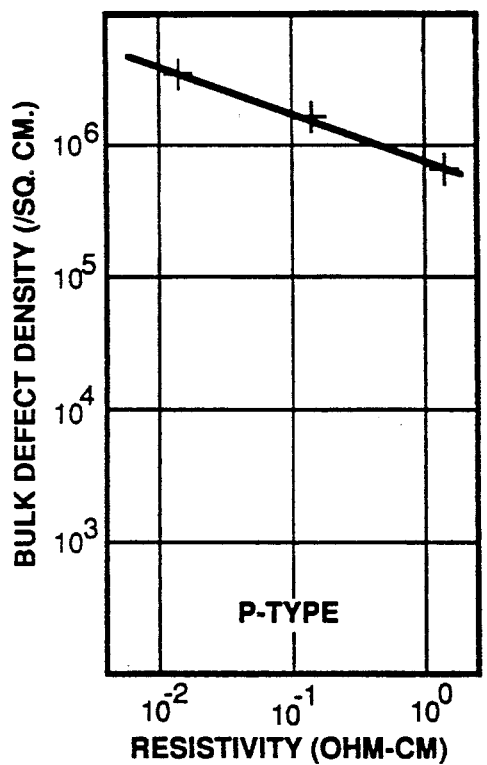
FIGS. 1A and 1B are plots of the observed bulk defect density versus resistivity for P and N type silicon, respectively, according to the prior art.
Figure 1B:
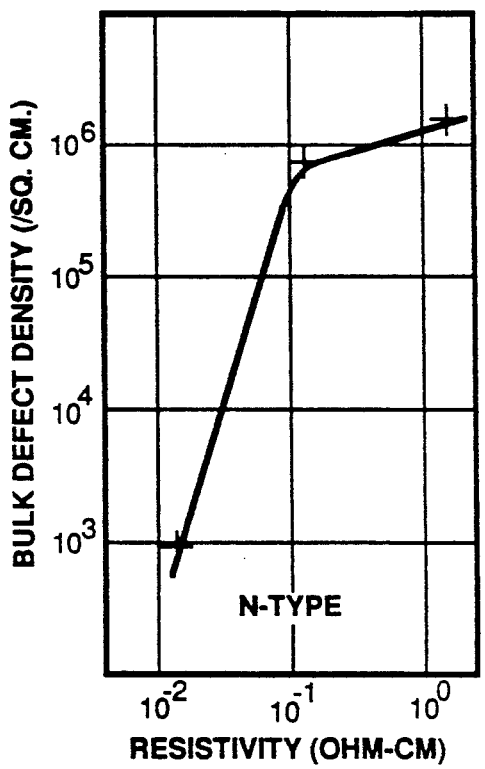

Despite the great effort that has been expended in the art, it has proved very difficult to create high bulk defect densities in heavily doped N-type semiconductor materials for the purpose of immobilizing fast diffusing species such as heavy metals. FIGS. 1A and 1B show the bulk defect densities obtained in P-type and N-type silicon as a function of resistivity using prior art methods, as reported by H. Tsuya et al., *Japanese Journal of Applied Physics*, Vol. 22, No, 16, 1983, pages L16–L18. it will be noted that with P-type material, comparatively high bulk defect densities are obtained which increase as resistivity decreases. However, the opposite is true for N-type material. For N-type material with resistivities below about $10^{-1}$ ohm-cm, commonly referred to as N+ material, the bulk defect density obtained using prior art techniques decreases from about $10^6$ to $10^3$ bulk defects/cm$^2$, the lower the resistivity, the lower the bulk defect density. Thus, a significant problem continues to exist with respect to providing N+ wafers (i.e., $\leq$ about $10^{-1}$ $\Omega$-cm), especially N++ wafers (i.e., $\leq$ about $10^{-2}$ $\Omega$-cm) having a high level of bulk defects suitable for immobilizing (i.e., gettering) fast diffusing species.

It is known that mechanical damage increases oxygen precipitation of lightly doped wafers at different temperatures. For example, see T. Takano, et al., "Annealing Effect of Mechanical Damage on Minute Defects, Heavy Metals and Oxygen Atoms in Silicon Crystals", *Semiconductor Silicon* 1981, *Electrochemical Society, Electronics and Dielectrics and Insulation Divisions, Proceedings*, Volume 81-5, 1981, pages 143–755 and K. H. Yang et al., "On the Interaction of Intrinsic and Extrinsic Gettering Schemes in Silicon"*Mat. Res. Soc. Symp. Proc.*, Vol. 36, 1985, pages 223–229. But, this has not so far resulted in the development in the prior art of a practical method for providing a sufficiently high density of bulk defects in N+, N++, or more heavily doped wafers. One of the difficulties has been that the temperatures used and/or the surface damage used in the prior art have tended to produce large amounts of gross crystal damage, e.g., slip, twins, surface stacking faults and the like, to such an extent that the quality of the wafers for device purposes was seriously degraded. A further difficulty has been that Prior art techniques have not yielded sufficient increase in bulk defect formation rate. Thus, up to the present time, no satisfactory solution has existed to the problem of obtaining higher bulk defect densities in highly doped N-type wafers without also introducing undesirable side effects.

It has been discovered that a higher density of bulk defects suitable for immobilizing fast diffusing species such as heavy metals is obtained in highly doped N-type wafers by providing an optimum amount of surface damage combined with at least a two step (two temperature) heating process that first nucleates and then grows precipitate complexes in the bulk of the wafer. The presence of the correct amount of surface damage, not too much and not too little, accelerates the rate of formation of bulk defects without causing significant adverse crystallographic anomalies. The two step heating process facilitates creation of a significant number of gettering sites in the bulk of the wafer under the surface damaged regions (and surface denuded zones if any).

In a preferred embodiment of the process, heavily doped N-type wafers containing a sufficient amount of dissolved precipitatable impurity are used. For silicon and germanium, non-limiting examples of suitable precipitatable impurities are oxygen, nitrogen, carbon and mixtures thereof. In the case of oxygen in N+silicon, suitable precipitatable impurity concentrations are 1-23 PPMA, preferably 10-18 PPMA and typically about 15 PPMA, as measured by the method described in "SIMS Measurement of Oxygen in Heavily Doped Silicon," *Mat. Res. Soc. Symp. Proc.*, Vol. 59, 1986, pages 73-78, based on the new ASTM Standard, F121-83e2 (see "Standard Method for Interstitial Atomic Oxygen Content of Silicon by Infrared Absorption", DIN 50438/1, *Annual Book of ASTM Standards,* 1985 or later editions). Means and methods for growing silicon, germanium and other semiconductor crystals containing suitable amounts of precipitatable impurities are well known in the art. Czochralski growth in a quartz crucible is a non-limiting example of a useful method for growing silicon or germanium single crystals containing dissolved oxygen.

After a semiconductor crystal containing a dissolved precipitatable impurity has been formed in the conventional manner, it is sliced into wafers using means well known in the art. Slicing using diamond saws or wire and slurry saws is suitable.

For the present invention it is essential that the wafer have a surface damage layer, that is, a region rich in crystallographic imperfections adjacent one or both major surfaces. Any means may be used for providing the appropriate surface damage layer, provided it is not too light or not too severe. Surface damage layers about 2-10 micrometers thickness are useful, with about 3-8 micrometers thickness being better, with 4-6 micrometers thickness being preferred and about 5 micrometers thickness being typical. It is important that the surface damage layer be uniform in depth and extent so that approximately the same amount of bulk defect formation enhancement is provided uniformly across the wafer. Lapping, sand blasting and ion bombardment are suitable means of providing the surface damage layer. It is convenient to provide an initial surface damage layer thicker than is required and then adjust the damage layer thickness by etching prior to heat treating the wafer.

Lapping is the preferred method of providing the surface damage layer. Lapping may be used to provide a surface damage layer thickness before etching of 2 or more micrometers, more conveniently about 4-20 micrometers thickness, preferably about 6-16 micrometers thickness and typically about 10 micrometers thickness. This initial lapping damage layer is reduced in thickness by, for example, etching sufficient material away to provide the desired surface damage layer thicknesses described above. Etching away about fifty percent of the initial lapping damage layer thickness is convenient. This is done before heat treatment.

As-sawn wafers already have a substantial surface damage layer, but it has been found that the coarser surface damage left after wafer sawing is usually too severe (e.g., damage depths $\geq 35$ micrometers) and too non-uniform to be useful. When as-sawn wafers are used, substantial gross crystal defects (e.g., slip, surface stacking faults, etc.) occur and the results are not uniform across the wafer. Accordingly, use of as-sawn wafers is not recommended.

A further reason for using lapping to provide the desired initial surface damage layer is that lapping can also provide wafer surfaces that are flat and parallel and with a convenient amount of damage in a single operation. This is a great manufacturing convenience. However, other methods for obtaining the desired amount of surface damage may also be used.

A suitable lapping apparatus is a type AL2 lapper manufactured by Peter Walters Company of West Germany. A wide variety of commercially available and well known lapping slurries can be used. $Al_2O_3$ is a suitable lapping grit. It is desirable to have the grit size in the range of about 10-30 micrometers in diameter, with about 10-15 micrometers being suitable and about 12-15 micrometers diameter being preferred. A suitable slurry is made by mixing 10-15% of type GL-6 suspension agent, manufactured by Professional Chemical Corporation, Chandler, AZ, with DI water plus 500 gms of $Al_2O_3$ powder of 15 micrometer size, per liter of slurry. Typical lapping conditions for 0.6 mm thick, 100 mm diameter, silicon wafers using the above-described slurry are, 15 rpm under 0.2-0.3 $Kgms/cm^2$ pressure for about 5-7 minutes or until the thickness of the wafers thickness is reduced, for example, by about 0.04 mm.

Following lapping (or other means of creating surface damage layers of the desired starting thickness), about half the depth of surface damage is etched away using any of several isotropic etch techniques well known in the art. Wet etching in a mixture of 72% by weight NaOH in DI water at 125° C., or in a mixture of nitric acid (57%) plus HF (14%) plus acetic acid (28%) by volume, is suitable although other etching means well known in the art may also be used. Examples are, dry plasma etching and other forms of wet chemical etching (e.g, KOH).

If too great a thickness of surface damage is left, then undesirable crystal defects are created (e.g., slip). If too little is left, then there is insufficient acceleration of bulk precipitate formation to produce sufficient bulk defects in a reasonable time period. Thus, it is important to have the proper amount of surface damage remaining before heat treatment, not too much and not too little.

The post-lap etching desirable removes about half of the thickness of the lapping (or other) surface damage layer. This leaves behind at least about 2-10 micrometers thickness of surface damage, generally about 3-8 micrometers thickness, preferably 4-6 micrometers thickness and typically about 5 micrometers thickness. Other means for arriving at about the same thickness of uniform surface damage may also be used. It is desirable that the surface damage layer be provided on both major surfaces of the wafer prior to the heating step since this increases the acceleration of bulk defect formation.

After the correct amount of surface damage has been provided, e.g., by lapping and etching, the wafer is then heat treated using at least a two temperature process, first lower temperature and then a higher temperature. The low-temperature, high-temperature sequence may be repeated. The lower temperature is chosen to foster precipitate nucleation and the higher temperature is chosen to facilitate growth of the already nucleated precipitates.

Precipitate nucleation and precipitate growth do not occur at single temperatures but over ranges of temperatures. In the case of oxygen in silicon, significant nucleation occurs above about 600-650° C., generally in the range of about 600-900° C. and more particularly in the range 650-850° C., with 700-800° C. being preferred and about 750-800° C. being typical. Exposure times in the range of at least 4 hours, and more particularly about 10-50 hours, are suitable, with about 10-30 hours being preferred and about 12-24 hours being typical.

Up to a certain temperature, (e.g., about 700° C. for oxygen in Si), the higher the temperature the shorter the exposure time to achieve substantially the same amount of nucleation. At higher temperatures (e.g., >850° C. for oxygen in Si), the rate of formation of new precipitate nuclei declines. At still higher temperatures, (e.g., ≧1000° C. for oxygen in Si), the rate of re-dissolution of precipitate nuclei exceeds the rate of formation of precipitate nuclei.

Significant growth of already formed precipitate nuclei occurs above about 900° C., more particularly in the range of about 900-1100° C. with 950-1050° C. being preferred and about 1000-1050° C. being typical. Exposure times in the range of at least 4 hours and more particularly about 10-50 hours are suitable, with about 10-30 hours being preferred and about 12-24 hours being typical. At each temperature, nuclei of a given critical size corresponding to that temperature will tend to grow by further precipitation of the dissolved impurity onto the nuclei, while nuclei smaller than the critical size will tend to shrink by re-dissolution of the precipitate impurity back into interstitial sites in the crystal lattice. The higher the temperature, the larger the critical nuclei size.

The foregoing two temperature heat treatment (i.e., low-temperature, high-temperature) promotes formation of bulk defects suitable for immobilizing (i.e., gettering) heavy metal impurities which may enter the semiconductor wafer during processing. This bulk process is accelerated by the presence of the adjacent surface defects. The exact mechanisms by which this occurs is not clear, but the result of higher bulk defect density is a great help in controlling the properties of the semiconductor material in critical device regions.

Following heat treatment, the wafers are optionally etched to remove the remaining surface damage layer and then, desirably polished and cleaned so as to be ready for subsequent wafer processing, including epitaxial layer growth if desired. Subsequent wafer processing often involves providing an epitaxial layer on one surface of the wafer. Where the temperature associated with epitaxial growth is sufficiently high, the epitaxial growth step may take the place of or supplement the second, high temperature portion of the heat treatment.

Etching and polishing to remove the remaining part of the surface damage layer is desirable where an epitaxial layer is to be grown on the wafer. One or both faces of the wafer may be polished. When a surface gettering layer is desired, it may be beneficial to polish just the front side of the wafer and leave the back side of the wafer un-etched and/or un-polished to provide additional back-side surface gettering capability.

The wafers are cleaned using means well known in the art and are then ready for wafer processing appropriate to the particular devices or circuits being fabricated, including but not limited to the provision of an epitaxial layer in which devices or circuits may be constructed where the highly doped substrate forms a support for or contact to the device or both.

One application where higher bulk defect density in very helpful, is in connection with devices formed in epitaxial layers on N+ substrates, a common arrangement in high performance IC's. It is desirable to have a high density of bulk defects in the N+ substrate to act as a sink for heavy metal contamination so that the contamination preferentially remains in or diffuses to the substrate where it becomes immobilized and electrically inactive and does not interfere with device operation in the epitaxial layer. Thus, increasing the bulk defect density in N+ substrates has great practical significance.

EXAMPLE

Figure 2:
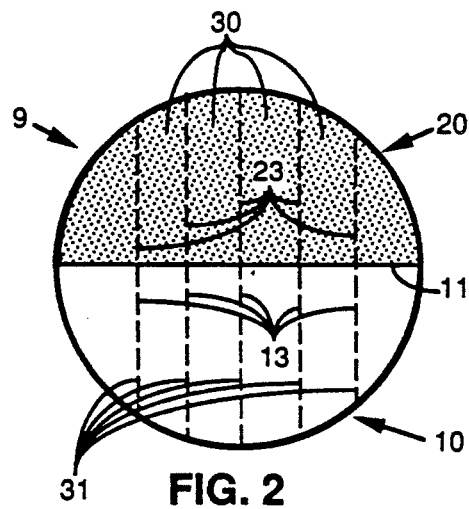
FIG. 2 is a simplified plan view of a wafer illustrating the test configuration used in the present invention.
Figure 3:
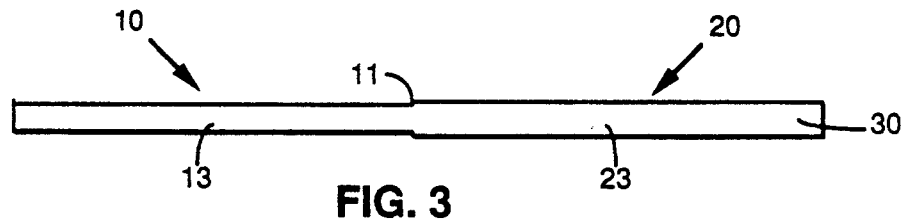
FIG. 3 is a simplified side view of a strip cut from the wafer of FIG. 2, after fracture to expose interior cross-section surfaces.

FIG. 2 shows a simplified plan view of wafer 9 indicating the regions 10, 20 used for test purposes. FIG. 3 is a simplified side view of strip 30 cut from the wafer of FIG. 2, after it has been fractured at locations 13, 23.

Referring now to FIGS. 2-3, as-sawn and cleaned N+ silicon wafers 9 of 100 mm diameter and 0.6 mm thickness containing about 15 PPMA dissolved oxygen were lapped as described above to reduce the wafer thickness to about 0.56 mm and produce a surface damage layer about 10-12 micrometers deep. The lapped wafers were then etched a first time using the 72% NaOH/DI water etch at 125° C. to remove about half the lap damage, leaving a substantially uniform residual surface damage region about 5-6 micrometers deep on both major faces of each water. These steps were carried out using the means and methods previously described. Then, lower half 10 of each wafer was further etched a second time to remove the remaining lapping damage therefrom. This provides the configuration shown in FIGS. 2-3, where lower wafer portion 10 below line 11 has all surface damage removed by the second (half-wafer) etch and upper wafer portion 20 above line 11 still has about micrometers depth of lapping damage remaining. Thus, each wafer contains defect free surface region 10 as a control and damaged surface region 20 for test purposes.

The wafers were then heat treated using the two temperature method described above (e.g., low-high, or low-high-low-high) and inspected for grass crystalline defects. The level of gross crystalline defects on wafer portion 20 was not significantly greater than on wafer portion 10. The wafers were then cleaved into strips 30 lying along dashed lines 31. The long dimensions of strips 30 were oriented approximately perpendicular to line 11. Strips 30 contained portions from both lower region 10 and upper region 20 (see FIG. 2). Cleaving exposed crystal cleavage surfaces 13, 23 extending through the thickness of strip 30 (see FIG. 3). Cleavage surfaces 13, 23 were approximately perpendicular to the principal wafer surfaces.

The cleavage surfaces 13, 23 were given a Wright etch for two minutes, using means well known in the art, to reveal the bulk defects, that is, the defects occurring in the body of the crystal remote from the major surfaces. The bulk defects revealed on exposed cleavage surfaces 13, 23 were then counted under 200X magnification. The cleavage surfaces 13, 23 showed denuded zones adjacent the major wafer faces. These denuded zones were about 30-100 micrometers thick, typically about 50 micrometers thick. Because the interest is in bulk defect formation, these surface denuded zones were ignored in determining the bulk defect density. The results are shown in Table I below.

In Table I, the convention (aEb) standing for (a×10^b) is used to express the observed number of bulk defects per square centimeter of cleavage surface. For example, 1.6E3 = 1.6×10³ defects/cm². The heat treatments (HT1, HT2, HT3) given to the various test wafers to nucleate and grow oxygen precipitate defects are also indicated, using the convention (temperature/time+-temperature/time+etc.). The wafers were heated in a nitrogen atmosphere. The number of defects per square centimeter counted on cleavage surfaces 13 are shown in the column headed "Damage Free Surfaces" and the number of defects per square centimeter on cleavage surface 23 are shown in the column headed "Damage Surfaces".

TABLE I

| | MEASURED BULK DEFECT DENSITY IN #/CM² | | |
|---|---|---|---|
| WAFER ID | RESISTIVITY OHM-CM | DAMAGE FREE SURFACES | DAMAGE SURFACES |
| A-HT1 | 0.0160 | 1.6E3 | 6.0E3 |
| B-HT1 | 0.0164 | 1.5E3 | 8.5E3 |
| C-HT2 | 0.0143 | 1.7E3 | 1.3E4 |
| D-HT2 | 0.0160 | 3.5E3 | 1.7E4 |
| E-HT3 | 0.0142 | 1.5E4 | 2.3E4 |
| F-HT3 | 0.0166 | 7.5E3 | 1.3E4 |
| G-HT3 | 0.0149 | 1.6E4 | 1.8E4 |

HT1 = 800° C./16 hrs + 1000° C./4 hrs + 750° C./24 hrs + 1050° C./16 hrs
HT2 = 800° C./16 hrs + 1000° C./16 hrs + 750° C./24 hrs + 1050° C./16 hrs
HT3 = 750° C./4 hrs + 1050° C./24 hrs It is apparent from the data of Table I that there is a significantly higher density of bulk defects in the deep wafer regions underlying the damaged surfaces (e.g., the lapped and partially etched surfaces) than in the deep wafer regions underlying the substantially damage free surfaces (e.g., all surface damage removed). Thus, by providing surface damage regions of the correct thickness and then heat treating in the prescribed manner, the bulk defect density of highly doped N-type wafers is increased without creating other crystallographic anomalies. The damaged surfaces accelerate precipitate nucleation and growth in the underlying bulk without producing slip, stacking faults, twins or the like.

Having thus described the invention, it will be apparent to those of skill in the art that the present invention provides higher densities of bulk defects for immobilizing (i.e., gettering) fast diffusing impurities in highly doped N-type wafers, and without inducing other, undesirable, crystal defects. This is an improvement of great significance in device manufacture employing highly doped N-type substrate wafers, since such wafers are widely used and the increased density of bulk defects provides the ability to getter more heavy metals and other fast diffusing species introduced during the wafer processing associated with device manufacture. This improves the yield and performance of finished devices and circuits.

While the particular means and method have been illustrated in terms of oxygen in silicon, those of skill in the art will appreciate based on the description herein that the invented means and method applies to other precipitatable impurities and other semiconductors and to other means of producing an appropriate surface damage layer. Non-limiting examples of precipitatable impurities are oxygen, nitrogen, carbon and combinations thereof and non-limiting examples of suitable semiconductors are silicon, germanium and combinations thereof. Other means of producing an appropriate surface damage layer are sand blasting and ion bombardment.

While the invented means and method refers to particular implementations, it is intended to include in the claims that follow those variations and modifications as will occur to those of skill in the art based on the description herein.

I claim:

1. A method for fabricating semiconductor devices or circuits having bulk defects therein, comprising:
    providing a highly doped N-type semiconductor wafer containing a dissolved precipitatable impurity and having opposed principal surfaces;
    lapping one or more surfaces leaving lapping damage therein;
    etching the lapped surface to remove some but not all of the lapping damage;
    heating the wafer to create bulk defects by lapping damage enhanced precipitating of the dissolved impurity; and thereafter
    etching the lapped surface to remove the remaining lapping damage.

2. The method of claim 1 wherein the lapping and etching steps provide a surface damage layer of 2-10 micrometers thickness.

3. The method of claim 2 wherein the heating step comprises heating to about 650-850° C. for 4-50 hours and about 900-1100° C. for about 10-50 hours.

4. The method of claim 3 wherein the heating step comprises heating to about 700-800° C. for 4-50 hours and about 950-1050° C. for about 10-50 hours.

5. The method of claim 4 wherein the heating step comprises heating to about 700-800° C. for 10-30 hours and about 950-1050° C. for about 10-30 hours.

6. The method of claim 1 wherein the lapping step comprises lapping one or more surfaces, leaving lapping damage extending to a depth of about 2-20 micrometers beneath the lapped surface.

7. The method of claim 6 wherein the etching step comprises etching the lapped surface to remove about half the depth of the lapping damage, leaving at least about 2 micrometers damage depth.

8. The method of claim 1 further comprising polishing the lapped surface and thereafter cleaning the wafer.

9. The method of claim 1 wherein the the lapping step comprises lapping both major surfaces.

10. A method for providing a semiconductor device having therein a precipitated impurity, comprising:
    providing a highly doped N-type semiconductor wafer having therein dissolved precipitatable impurity;
    providing a surface damage layer about 2-10 micrometers deep;
    heating the wafer to a first temperature and time sufficient to produce precipitate nucleation and then to a second temperature higher than the first temperature and for a second time to produce precipitate growth; and
    thereafter etching the lapped surface to remove the remainder of the surface damage layer.

11. The method of claim 10 wherein the heating step comprises heating the lapped wafer to a first temperature exceeding about 650° C. and for a first time and then to a second temperature higher than the first temperature and for a second time.

12. The method of claim 11 wherein the heating step comprises heating the lapped wafer to a first temperature exceeding about 650° C. and for a first time and then to a second temperature exceeding about 900° C. for a second time.

13. The method of claim 12 wherein the heating step comprises heating the lapped wafer to a first temperature exceeding about 700° C. and for a first time and then to a second temperature exceeding about 950° C. for a second time.

14. The method of claim 11 wherein the heating step comprises heating the lapped wafer to a first temperature exceeding about 650° C. and for a first time in the range of 4-50 hours and then to a second temperature exceeding about 900° C. for a second time in the same range.

15. The method of claim 10 wherein the providing step comprises providing a silicon wafer having therein dissolved precipitatable impurity of oxygen, nitrogen, carbon or a combination thereof.

16. A product made by the process of claim 10.

* * * * *